(12) United States Patent
Chen et al.

(10) Patent No.: US 10,593,877 B2
(45) Date of Patent: Mar. 17, 2020

(54) RESISTIVE RANDOM ACCESS MEMORY

(71) Applicant: Winbond Electronics Corp., Taichung (TW)

(72) Inventors: Frederick Chen, San Jose, CA (US); Ping-Kun Wang, Taichung (TW); Shao-Ching Liao, Taichung (TW); Po-Yen Hsu, Taichung (TW); Yi-Hsiu Chen, Taichung (TW); Ting-Ying Shen, Taichung (TW); Bo-Lun Wu, Taichung (TW); Meng-Hung Lin, Taichung (TW); Chia-Hua Ho, Taichung (TW); Ming-Che Lin, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/949,078

(22) Filed: Apr. 10, 2018

(65) Prior Publication Data
US 2018/0233665 A1 Aug. 16, 2018

Related U.S. Application Data

(63) Continuation-in-part of application No. 14/967,386, filed on Dec. 14, 2015, now Pat. No. 9,972,779.

(51) Int. Cl.
*H01L 45/00* (2006.01)
*H01L 27/24* (2006.01)

(52) U.S. Cl.
CPC ........ *H01L 45/146* (2013.01); *H01L 27/2463* (2013.01); *H01L 45/08* (2013.01); *H01L 45/122* (2013.01); *H01L 45/1253* (2013.01); *H01L 45/1266* (2013.01); *H01L 45/1616* (2013.01)

(58) Field of Classification Search
CPC ..... H01L 45/146; H01L 45/08; H01L 45/122; H01L 45/1253; H01L 45/1266; H01L 45/1616; H01L 27/2463
See application file for complete search history.

(56) References Cited

U.S. PATENT DOCUMENTS

| 8,963,114 B2 | 2/2015 | Liao et al. |
| 9,076,519 B2 | 7/2015 | Hong et al. |
| 9,257,642 B1 * | 2/2016 | Chang ................. H01L 45/1253 |
| 9,385,316 B2 | 7/2016 | Liao et al. |

(Continued)

FOREIGN PATENT DOCUMENTS

| TW | 201436110 | 9/2014 |
| TW | 201539816 | 10/2015 |

*Primary Examiner* — Mark W Tornow
(74) *Attorney, Agent, or Firm* — JCIPRNET

(57) ABSTRACT

A resistive random access memory is provided. The resistive random access memory includes a bottom electrode over a substrate, a top electrode, a resistance-switching layer, an oxygen exchange layer, and a sidewall protective layer. The top electrode is disposed over the bottom electrode. The resistance-switching layer is disposed between the bottom electrode and the top electrode. The oxygen exchange layer is disposed between the resistance-switching layer and the top electrode. The sidewall protective layer containing metal or semiconductor is disposed at sidewalls of the resistance-switching layer, and the sidewalls of the resistance-switching layer is doped with the metal or semiconductor from the sidewall protective layer.

18 Claims, 4 Drawing Sheets

(56) References Cited

U.S. PATENT DOCUMENTS

| | | | |
|---|---|---|---|
| 2009/0102598 A1* | 4/2009 | Yamazaki | H01L 45/04 338/20 |
| 2011/0291066 A1* | 12/2011 | Baek | H01L 45/08 257/4 |
| 2014/0264229 A1* | 9/2014 | Yang | H01L 45/16 257/4 |
| 2014/0322862 A1* | 10/2014 | Xie | H01L 27/2481 438/104 |
| 2015/0104882 A1 | 4/2015 | Jung et al. | |

* cited by examiner

RESISTIVE RANDOM ACCESS MEMORY

CROSS-REFERENCE TO RELATED APPLICATION

This application is a continuation-in-part of U.S. patent application Ser. No. 14/967,386, filed on Dec. 14, 2015. The entirety of the above-mentioned patent application is hereby incorporated by reference herein and made a part of this specification.

BACKGROUND OF THE INVENTION

Field of the Invention

The invention relates to a non-volatile memory, and particularly a resistive random access memory.

Description of Related Art

The resistive random access memory (RRAM) is a type of non-volatile memory. With advantages including low voltage of write operations, short time for erasing writes, long memory time, non-destructive reading, multi-state memory, structural simplicity, and little space required, the resistive random access memory will become one of the non-volatile memory devices generally adopted in personal computers and electronic devices, and it is being widely researched.

Generally speaking, the resistive random access memory has a metal-insulating layer-metal (MIM) structure composed of a top electrode, a bottom electrode, and an intervening resistance-switching layer. However, in the manufacturing process of a resistive random access memory, sidewalls of the metal-insulating layer-metal structure are subject to plasma damage or contamination by impurities, which affects conductive paths (positions of a filament structure) in the resistive random access memory and further deteriorate the high-temperature data retention (HTDR). Therefore, in the manufacturing process of resistive random access memory devices, solving problems including plasma damage and contamination by impurities caused to the sidewalls of the metal-insulating layer-metal structure has become an important issue in the current development of the resistive random access memory technologies.

SUMMARY OF THE INVENTION

The invention provides a resistive random access memory capable of enhancing the high-temperature data retention property and durability of memory devices and improving the yield and stability of memory devices.

The resistive random access memory of the invention includes a bottom electrode, a top electrode, a resistance-switching layer, an oxygen exchange layer, and a sidewall protective layer. The bottom electrode is disposed over a substrate. The top electrode is disposed over the bottom electrode. The resistance-switching layer is disposed between the bottom electrode and the top electrode. The oxygen exchange layer is disposed between the resistance-switching layer and the top electrode. The sidewall protective layer containing metal or semiconductor is disposed at the sidewalls of the resistance-switching layer, and the sidewalls of the resistance-switching layer is doped with the metal or semiconductor from the sidewall protective layer.

To provide a further understanding of the aforementioned and other features and advantages of the invention, exemplary embodiments, together with the reference drawings, are described in detail below.

DESCRIPTION OF THE EMBODIMENTS

Figure 1A:
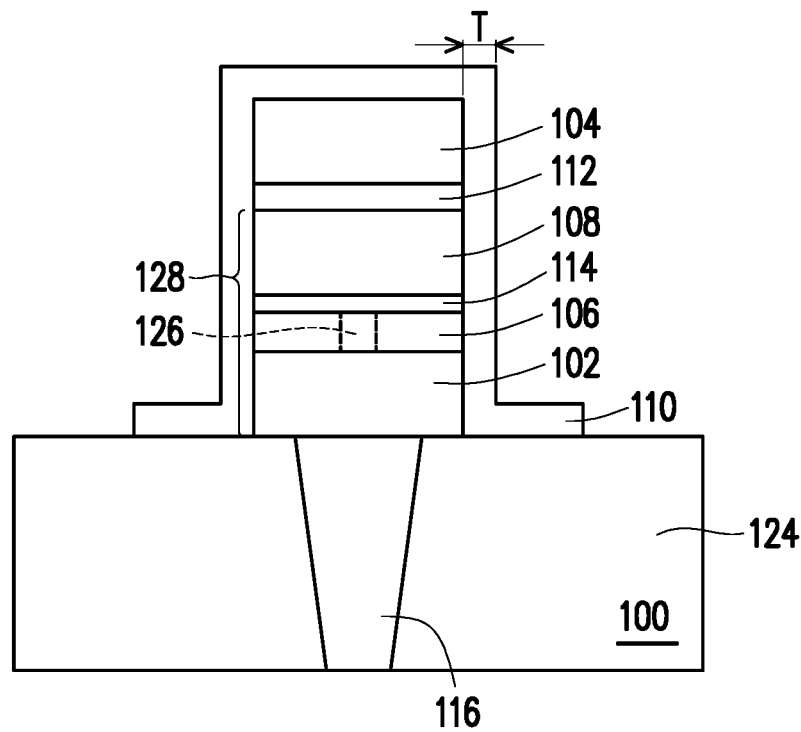
FIG. 1A is a cross-sectional view of a resistive random access memory according to a first embodiment of the invention.

The concept of the invention may be more sufficiently understood with reference to the attached drawings that show the embodiments of the invention. However, the invention may be further realized in many different forms and should not be interpreted as limited to the embodiments described below. In fact, the embodiments provided below merely serve to elaborate the invention more completely and in detail, and to fully convey the scope of the invention to people of ordinary skill in the art.

In the drawings, sizes and relative sizes of each layer and region may be illustrated in exaggeration for the sake of clarity.

Figure 1B:
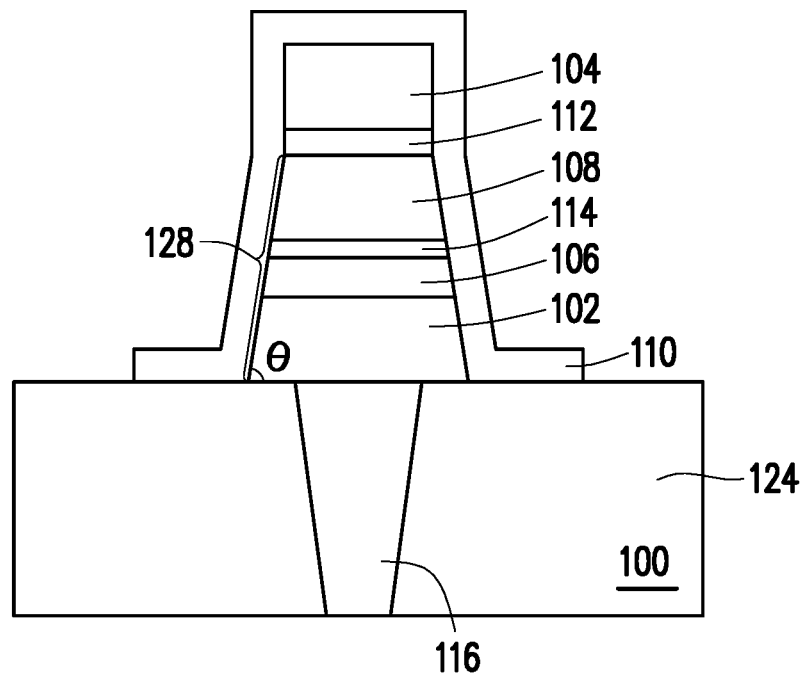
FIG. 1B is a cross-sectional view of a resistive random access memory according to a modified first embodiment of the invention.

FIG. 1A is a cross-sectional view of a resistive random access memory according to a first embodiment of the invention. FIG. 1B is a cross-sectional view of a resistive random access memory according to a modified first embodiment of the invention.

Referring to FIG. 1A, the resistive random access memory includes a bottom electrode 102, a top electrode 104, a resistance-switching layer 106, an oxygen exchange layer 108, and a sidewall protective layer 110.

The bottom electrode 102 is disposed over a substrate 100. A material of the bottom electrode 102 is titanium nitride (TiN) or indium tin oxide (ITO), for example. The bottom electrode 102 is electrically connected to a drain region in a transistor (not illustrated) via a plug 116. The plug 116 is disposed in an interlayer insulating layer 124, for example, and the bottom electrode 102 is disposed on the interlayer insulating layer 124. The bottom electrode 102 is formed by the method of physical vapor deposition (PVD) or atomic layer deposition (ALD), for example.

The top electrode 104 is disposed over the bottom electrode 102. A material of the top electrode 104 includes an electrically conductive material such as titanium nitride (TiN) or indium tin oxide (ITO). The top electrode 104 is formed by the method of physical vapor deposition (PVD) or atomic layer deposition (ALD), for example.

The resistance-switching layer 106 is disposed between the bottom electrode 102 and the top electrode 104. A material of the resistance-switching layer 106 is a transition metal oxide, for example, such as hafnium oxide ($HfO_2$), tantalum oxide ($Ta_2O_5$), or another suitable metal oxide. The resistance-switching layer 106 is formed by the method of physical vapor deposition (PVD) or atomic layer deposition (ALD), for example. The bottom electrode 102 should not form an abrupt corner at its interface with the resistance-switching layer 106 in order to avoid unwanted filaments at that location, due to stray electric fields.

The oxygen exchange layer 108 is disposed between the resistance-switching layer 106 and the top electrode 104. A material of the oxygen exchange layer 108 is titanium, titanium-rich titanium nitride, tantalum, hafnium, zirconium, platinum, or aluminum, for example. The oxygen exchange layer 108 is formed by the method of physical vapor deposition (PVD) or atomic layer deposition (ALD), for example.

A block layer 114 is further disposed between the oxygen exchange layer 108 and the resistance-switching layer 106. The block layer 114 is effective in preventing or slowing neutral species such as oxygen going through the block, but does not prevent or inhibit charged species such as oxygen ions or electrons from going through under electric field. Note that this is different from a diffusion barrier, which prevents all species crossing and therefore prevents device operation. A material of the block layer 114 can be titanium-doped aluminum oxide, aluminum-doped titanium oxide, tantalum-doped titanium oxide, titanium-doped tantalum oxide, aluminum-doped tantalum oxide, tantalum-doped aluminum oxide, aluminum-doped hafnium oxide, hafnium-doped aluminum oxide, titanium-doped hafnium oxide, hafnium-doped titanium oxide, silicon-doped hafnium oxide, or zirconium-doped hafnium oxide. The block layer 114 is formed by the method of physical vapor deposition (PVD) or atomic layer deposition (ALD) of a metal oxide. The metal oxide film may be reduced under a process thermal budget of 350-450° C. to form a suboxide of the metal, as oxygen enters the oxygen exchange layer, so that its oxygen composition is lower than the usual or normal oxide stoichiometry. It is also possible that some metal escapes from an extremely thin (<3 nm) block layer 114 into the oxygen exchange layer 108, thereby resulting in the oxygen exchange layer effectively having a portion adjacent the resistance-switching layer, consisting effectively of the metal oxide doped with the element(s) from the oxygen exchange layer. In one embodiment, the metal oxide is aluminum oxide which is effectively absorbed into the lower portion of the oxygen exchange layer, consisting of titanium. Under thermal conditions (at least 425° C.) and possibly bias, the oxygen typically diffuses and mixes with the titanium first, resulting in a titanium oxide layer. The aluminum subsequently mixes with this layer, resulting in an aluminum-doped titanium oxide layer forming the bottom portion of the oxygen exchange layer, with an oxidized titanium upper portion above it. The doped oxide may also be sub-stoichiometric with respect to oxygen, thus it is also capable of exchanging oxygen with the resistance-change layer, at least partially, while also allowing oxygen to go through to the upper portion of the oxygen exchange layer. The oxygen exchange layer 108 should not form an abrupt corner with the block layer 114 in order to avoid unwanted filaments at that location. Preferably, the sidewalls of the oxygen exchange layer 108, the block layer 114, the resistance-switching layer 106, and the bottom electrode 102 constitute a substantially continuous surface 128. Besides titanium, the oxygen exchange layer 108 may include tantalum, zirconium, or hafnium, for example. The deposited metal oxide, besides being aluminum oxide, can be titanium oxide, tantalum oxide, or zirconium oxide.

The sidewall protective layer 110 is at least disposed at the substantially continuous surface 128. A thickness T of the sidewall protective layer 110 is, for example, between 5 nm and 20 nm. If the sidewall protective layer 110 is used as an oxygen supply layer, a material of the sidewall protective layer 110 includes aluminum oxide ($Al_2O_3$), silicon oxide ($SiO_2$), hafnium oxide ($HfO_2$), or zirconium oxide ($ZrO_2$). The sidewall protective layer 110 is formed by the method of atomic layer deposition (ALD), for example. In addition, the sidewall protective layer 110 may be further disposed at the sidewalls of the top electrode 104.

As FIG. 1A shows, an oxygen-rich layer 112 is further optionally disposed between the oxygen exchange layer 108 and the top electrode 104. The oxygen-rich layer 112 prevents current spreading so as to increase current density and further enhance the high-temperature data retention ability. It also prevents the oxygen in the oxygen exchange layer 108 from leaking out to the top electrode 104. A material of the oxygen-rich layer 112 is aluminum oxide, aluminum oxynitride, titanium oxynitride or tantalum oxynitride, for example. The oxygen-rich layer 112 is formed by the method of physical vapor deposition (PVD) or atomic layer deposition (ALD), for example.

As FIG. 1B shows, the substantially continuous surface 128 is sloped. An angle θ between the substantially continuous surface 128 and a bottom surface of the bottom electrode 102 is, for example, 60-90 degrees. A smooth surface 128 is better to avoid abrupt corner formed between resistance-switching layer 106 and the block layer 114, or formed between the block layer 114 and the oxygen exchange layer 108.

In the present embodiment, since the sidewall protective layer 110 (oxygen supply layer) is disposed at the sidewalls of the oxygen exchange layer 108, oxygen in the sidewall protective layer 110 (oxygen supply layer) is drawn into the oxygen exchange layer 108, such that an outer portion of the oxygen exchange layer 108 is partially oxidized. Accordingly, the resistance-switching layer 106 below the oxygen exchange layer 108 generates an oxygen vacancy segment at a central portion only, which contributes to the formation of a filament structure 126. In other words, when oxygen vacancy density increases at the central portion, the filament structure 126 is concentrated at the central portion. The concentrated filament structure 126 also contributes to enhancement of the high-temperature data retention (HTDR) property of memory devices. Moreover, the sidewall protective layer 110 (oxygen supply layer) also prevents outward spreading of oxygen drawn toward the central filament structure 126, thereby ensuring return of oxygen in a reset operation and improving durability.

Figure 2:
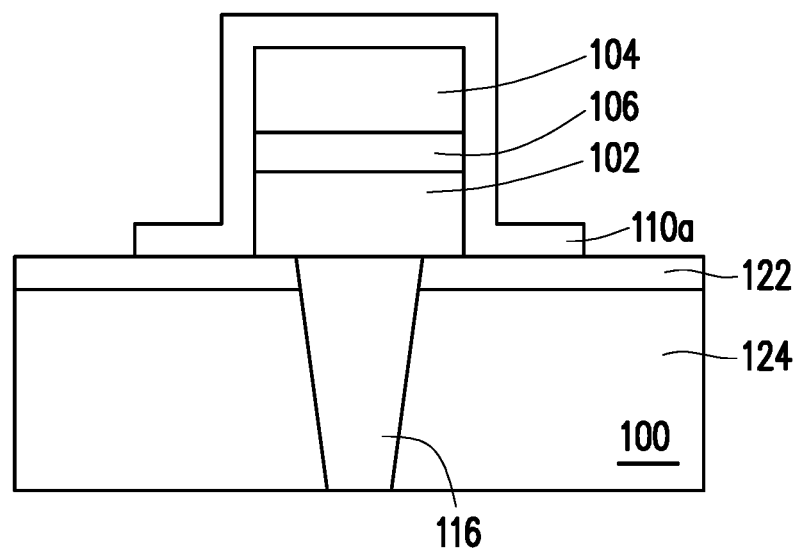
FIG. 2 is a cross-sectional view of a resistive random access memory according to a second embodiment of the invention.

FIG. 2 is a cross-sectional view of a resistive random access memory according to a second embodiment of the invention. In FIG. 2, elements that are identical to those in the first embodiment are marked with the same numerals. Where the materials and properties of each of the layers described below are not specified in detail, they are regarded as identical to those in the first embodiment.

Referring to FIG. 2, the resistive random access memory includes a bottom electrode 102, a top electrode 104, a resistance-switching layer 106, an oxygen exchange layer 108, and a sidewall protective layer 110a.

The bottom electrode 102 is disposed over a substrate 100. A material of the bottom electrode 102 is titanium nitride (TiN) or indium tin oxide (ITO), for example. The bottom electrode 102 is electrically connected to a drain region in a transistor (not illustrated) via a plug 116. The plug 116 is disposed in an interlayer insulating layer 124, for example, and the bottom electrode 102 is disposed over the interlayer insulating layer 124. The bottom electrode 102 is formed by the method of physical vapor deposition (PVD) or atomic layer deposition (ALD), for example.

The top electrode 104 is disposed over the bottom electrode 102. A material of the top electrode 104 includes an electrically conductive material such as titanium nitride (TiN) or indium tin oxide (ITO). The top electrode 104 is formed by the method of physical vapor deposition (PVD) or atomic layer deposition (ALD), for example.

The resistance-switching layer 106 is disposed between the bottom electrode 102 and the top electrode 104. A material of the resistance-switching layer 106 is a transition metal oxide, for example, such as hafnium oxide ($HfO_2$), tantalum oxide ($Ta_2O_5$), or another suitable metal oxide. The resistance-switching layer 106 is formed by the method of physical vapor deposition (PVD) or atomic layer deposition (ALD), for example. The bottom electrode 102 and top electrode 104 should not form abrupt corners at their interface with the resistance-switching layer 106 in order to avoid unwanted filaments at that location, due to unwanted enhanced electric fields. The edges of the resistance-switching layer 106, the top electrode 104 and the bottom electrode 102 are continuously linked.

As FIG. 2 shows, a capping layer 122 is further optionally disposed between the bottom electrode 102 and the substrate 100 (interlayer insulating layer 124). The capping layer 122 prevents contaminants from the interlayer insulating layer 124, such as hydrogen, from entering the bottom electrode 102 or the metal-insulating layer-metal structure. A material of the capping layer 122 includes a metal oxide such as aluminum oxide ($Al_2O_3$), titanium oxide ($TiO_2$), tantalum oxide ($TaO_2$), or zirconium oxide ($ZrO_2$).

In addition, the resistive random access memory of the present embodiment may be disposed with an oxygen exchange layer, an oxygen-rich layer, and a block layer according to the needs, as in the first embodiment.

Figure 3:
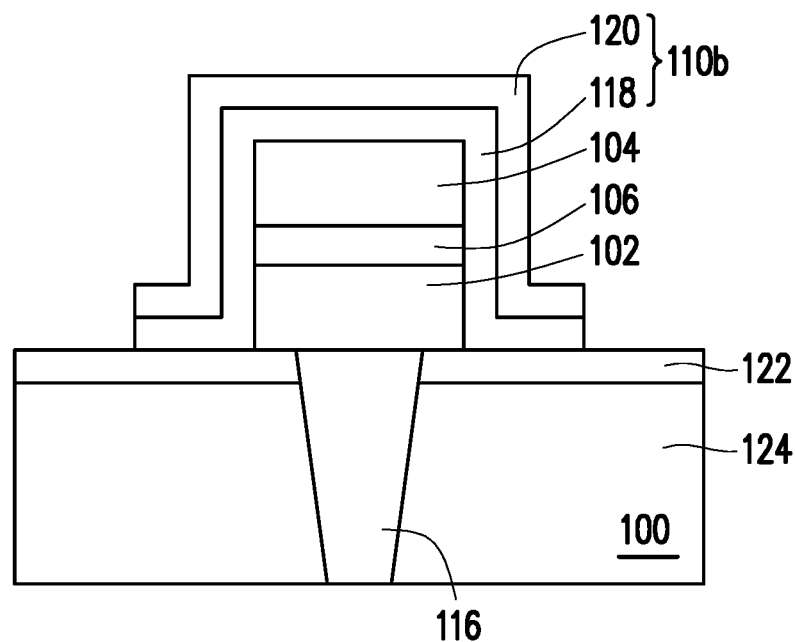
FIG. 3 is a cross-sectional view of a resistive random access memory according to a third embodiment of the invention.

FIG. 3 is a cross-sectional view of a resistive random access memory according to a third embodiment of the invention. In FIG. 3, elements that are identical to those in the first embodiment are marked with the same numerals. Where the materials and properties of each of the layers described below are not specified in detail, they are regarded as identical to those in the first embodiment.

Referring to FIG. 3, the resistive random access memory includes a bottom electrode 102, a top electrode 104, a resistance-switching layer 106, an oxygen exchange layer 108, and a sidewall protective layer 110b.

The bottom electrode 102 is disposed over a substrate 100. A material of the bottom electrode 102 is titanium nitride (TiN) or indium tin oxide (ITO), for example. The bottom electrode 102 is electrically connected to a drain region in a transistor (not illustrated) via a plug 116. The plug 116 is disposed in an interlayer insulating layer 124, for example, and the bottom electrode 102 is disposed over the interlayer insulating layer 124. The bottom electrode 102 is formed by the method of physical vapor deposition (PVD) or atomic layer deposition (ALD), for example.

The top electrode 104 is disposed over the bottom electrode 102. A material of the top electrode 104 includes an electrically conductive material such as titanium nitride (TiN) or indium tin oxide (ITO). The top electrode 104 is formed by the method of physical vapor deposition (PVD) or atomic layer deposition (ALD), for example.

The resistance-switching layer 106 is disposed between the bottom electrode 102 and the top electrode 104. A material of the resistance-switching layer 106 is a transition metal oxide, for example, such as hafnium oxide ($HfO_2$), tantalum oxide ($Ta_2O_5$), or another suitable metal oxide. The resistance-switching layer 106 is formed by the method of physical vapor deposition (PVD) or atomic layer deposition (ALD), for example.

The sidewall protective layer 110b is a liner layer, for example. In the present embodiment, the sidewall protective layer 110b includes a first liner layer 118 and a second liner layer 120. The first liner layer 118 is disposed at sidewalls of the bottom electrode 102, the resistance-switching layer 106, and the top electrode 104. The second liner layer 120 is disposed on the first liner layer 118. A material of the first liner layer 118 includes a metal sub-oxide such as aluminum-rich aluminum oxide (AlOx, x<1.5). The first liner layer 118 is formed by the method of atomic layer deposition (ALD), for example, followed by a reduction under a process thermal budget of 350-450° C. A material of the second liner layer 120 includes another oxide, a metal nitride or a metal titanate, formed by CVD or PVD. The metal nitride is aluminum nitride, silicon nitride, or tantalum nitride, for example. The metal titanate is strontium titanate or bismuth titanate, for example.

As FIG. 3 shows, a capping layer 122 is further optionally disposed between the bottom electrode 102 and the substrate 100 (interlayer insulating layer 124). The capping layer 122 prevents contaminants from the interlayer insulating layer 124, such as hydrogen, from entering the bottom electrode 102. A material of the capping layer 122 includes a metal oxide such as aluminum oxide ($Al_2O_3$), titanium oxide ($TiO_2$), tantalum oxide ($TaO_2$), or zirconium oxide ($ZrO_2$).

In addition, the resistive random access memory of the present embodiment may be disposed with an oxygen exchange layer, an oxygen-rich layer, and a block layer according to the needs, as in the first embodiment.

Figure 4:
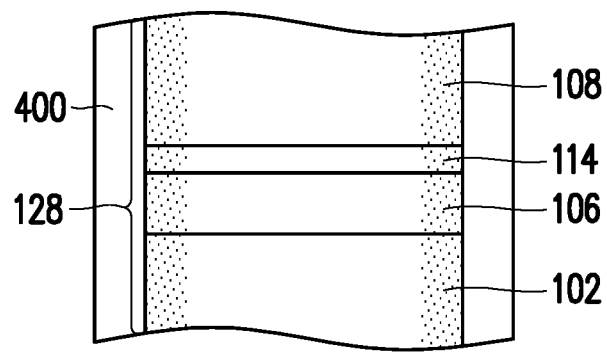
FIG. 4 is a cross-sectional view of a resistive random access memory according to a fourth embodiment of the invention.

FIG. 4 is a cross-sectional view of a resistive random access memory according to a fourth embodiment of the invention. For clarity, some elements are omitted, and the omitted elements can refer to above embodiments. In the meantime, the embodiment adopts the same reference numbers as used in the first embodiment to refer to the same elements.

In FIG. 4, the sidewall protective layer 400 contains a metal or semiconductor, and thus the substantially continuous surface 128 can be doped with the metal or semiconductor (as shown by dots) from the sidewall protective layer 400. For example, the sidewall protective layer 400 contains aluminum or silicon. In other words, the metal such as aluminum has been doped into the sidewalls of the oxygen exchange layer 108, the block layer 114, the resistance-switching layer 106, and the bottom electrode 102. On one hand, the presence of aluminum or silicon, for example, acts to prevent filament formation at the edges, only allowing them to form toward the center of the resistance-switching layer 106. On the other hand, the oxygen concentration would be enhanced near the sidewall of the oxygen exchange layer 108. If the sidewall protective layer 400 is a readily reduced oxide, it can be used as an oxygen supply layer, such as aluminum oxide (0.3-3 nm thickness) being reduced under a process thermal budget of 350-450° C. to form a relatively aluminum-rich aluminum oxide (AlOx, x<1.5). If the sidewall protective layer 400 is silicon nitride, it should preferably be silicon-rich. The silicon-rich nitride or aluminum-rich oxide has further advantages of reduced tensile stress compared to stoichiometric silicon nitride, allowing easier filament forming from shorter distances between vacancy defects. The sidewall protective layer 400 is formed by the method of atomic layer deposition (ALD), for example. In other embodiment, the sidewall protective layer 400 is disposed at the sidewalls of the resistance-switching layer 106, so that the sidewalls of the resistance-switching layer 106 is doped with the metal or semiconductor from the sidewall protective layer 400. In addition, the sidewall protective layer 400 may be further disposed at the sidewalls of the top electrode 104. If necessary, the oxide used in the sidewall protective layer 400 may be doped to contain nitrogen, in order to control its reactivity.

Figure 5:
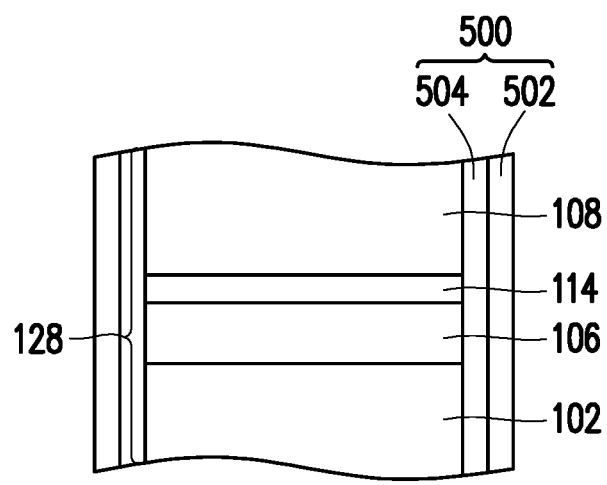
FIG. 5 is a cross-sectional view of a resistive random access memory according to a fifth embodiment of the invention.

FIG. 5 is a cross-sectional view of a resistive random access memory according to a fifth embodiment of the invention. For clarity, some elements are omitted, and the omitted elements can refer to above embodiments. In the meantime, the embodiment adopts the same reference numbers as used in the first embodiment to refer to the same elements.

In FIG. 5, the sidewall protective layer 500 is a multi-layer containing a first liner layer 504 on the substantially continuous surface 128 and a second liner layer 502 on the first liner layer 504. The first liner layer 504 acts to react directly with the resistance-switching layer 106 as needed, while the second liner layer 502 acts as passivation or possibly a contamination barrier.

Figure 6:
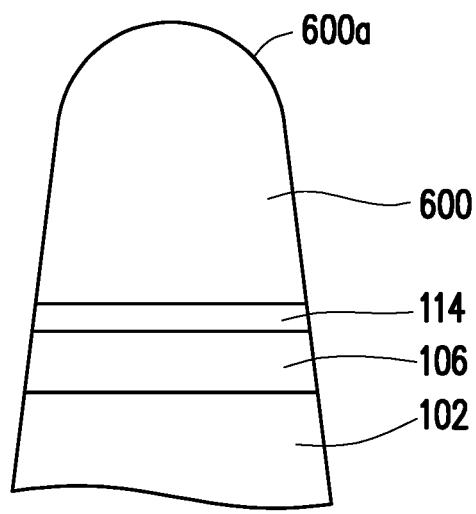
FIG. 6 is a cross-sectional view of a resistive random access memory according to a sixth embodiment of the invention.

FIG. 6 is a cross-sectional view of a resistive random access memory according to a sixth embodiment of the invention. For clarity, some elements are omitted, and the omitted elements can refer to above embodiments. In the meantime, the embodiment adopts the same reference numbers as used in the first embodiment to refer to the same elements.

In FIG. 6, the oxygen exchange layer 600 has a rounded top 600a, and a material of the oxygen exchange layer 600 includes titanium, titanium-rich titanium nitride, tantalum, hafnium, zirconium, platinum, or aluminum; preferably, titanium. The round top 600a allows the wider bottom edge of the oxygen exchange layer 600 to be filled by oxygen earlier than by oxygen entering from the resistance-switching layer 106, while the center of the oxygen exchange layer 600 has more room to take in more oxygen, favoring filaments in the center. Also, the current path is more likely to flow mostly in the center instead of crawling along the edges allowing current to be concentrated toward the center.

Figure 7:
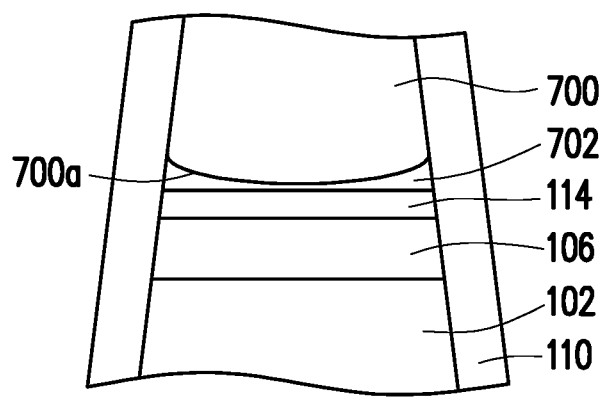
FIG. 7 is a cross-sectional view of a resistive random access memory according to a seventh embodiment of the invention.

FIG. 7 is a cross-sectional view of a resistive random access memory according to a seventh embodiment of the invention. For clarity, some elements are omitted, and the omitted elements can refer to above embodiments. In the meantime, the embodiment adopts the same reference numbers as used in the first embodiment to refer to the same elements.

In FIG. 7, the oxygen exchange layer 700 has a rounded bottom 700a, and a barrier 702 is further disposed between the block layer 114 and the rounded bottom 700a of the oxygen exchange layer 700. A material of the barrier layer 702 may include silicon dioxide ($SiO_2$), titanium oxide ($TiO_2$), hafnium oxide ($HfO_2$), tantalum oxide ($Ta_2O_5$), aluminum oxide ($Al_2O_3$), or zirconium oxide ($ZrO_2$). The round bottom 700a favors the filament formation at the center of the oxygen exchange layer 700 due to the thicker barrier toward the edge.

In summary of the above, in the resistive random access memory provided by the invention, the arrangement of the sidewall protective layer as a reduced stress layer as well as an oxygen supply layer or doping layer contributes to enhancement of the high-temperature data retention property and durability of memory devices and improves the yield and stability of memory devices.

Although the invention is disclosed as the embodiments above, the embodiments are not meant to limit the invention. Any person skilled in the art may make slight modifications and variations without departing from the spirit and scope of the invention. Therefore, the protection scope of the invention shall be defined by the claims attached below.

What is claimed is:

1. A resistive random access memory comprising:
    a bottom electrode disposed over a substrate;
    a top electrode disposed over the bottom electrode;
    a resistance-switching layer disposed between the bottom electrode and the top electrode;
    an oxygen exchange layer disposed between the resistance-switching layer and the top electrode; and
    a sidewall protective layer disposed at sidewalls of the resistance-switching layer, wherein a material of the sidewall protective layer comprises aluminum-rich aluminum oxide or silicon-rich silicon nitride, and the sidewalls of the resistance-switching layer, the oxygen exchange layer and the bottom electrode are doped with aluminum or silicon from the sidewall protective layer.

2. The resistive random access memory according to claim 1, wherein oxygen concentration is enhanced near the sidewalls of the oxygen exchange layer.

3. The resistive random access memory according to claim 1, wherein a thickness of the sidewall protective layer is between 5 nm and 20 nm.

4. The resistive random access memory according to claim 1, further comprising an oxygen-rich layer disposed between the oxygen exchange layer and the top electrode.

5. The resistive random access memory according to claim 4, wherein a material of the oxygen-rich layer comprises aluminum oxide, aluminum oxynitride, titanium oxynitride or tantalum oxynitride.

6. The resistive random access memory according to claim 1, wherein the material of the sidewall protective layer comprises aluminum-rich aluminum oxide, and the sidewall protective layer is doped with nitrogen.

7. The resistive random access memory according to claim 1, wherein a material of the oxygen exchange layer comprises titanium, titanium-rich titanium nitride, tantalum, hafnium, zirconium, platinum, or aluminum.

8. The resistive random access memory according to claim 1, wherein the sidewalls of the oxygen exchange layer, the resistance-switching layer, and the bottom electrode constitute a substantially continuous surface, and the substantially continuous surface is doped with aluminum or silicon.

9. The resistive random access memory according to claim 8, wherein an angle between the substantially continuous surface and a bottom surface of the bottom electrode is 60-90 degrees.

10. The resistive random access memory according to claim 1, wherein the sidewall protective layer is further disposed at sidewalls of the top electrode.

11. The resistive random access memory according to claim 1, wherein the sidewall protective layer is a multi-layer.

12. The resistive random access memory according to claim 11, wherein the multi-layer comprises:
a first liner layer disposed on the substantially continuous surface; and
a second liner layer disposed on the first liner layer.

13. The resistive random access memory according to claim 12, wherein a material of the first liner layer comprises aluminum-rich aluminum oxide.

14. The resistive random access memory according to claim 13, wherein a material of the second liner layer comprises aluminum nitride, silicon nitride, tantalum nitride, strontium titanate or bismuth titanate.

15. The resistive random access memory according to claim 1, wherein the oxygen exchange layer has a rounded top.

16. The resistive random access memory according to claim 1, wherein the oxygen exchange layer has a rounded bottom, and a barrier is further disposed between the resistance-switching layer and the rounded bottom of the oxygen exchange layer.

17. The resistive random access memory according to claim 16, wherein a material of the barrier comprises silicon dioxide ($SiO_2$), titanium oxide ($TiO_2$), aluminum oxide ($Al_2O_3$), tantalum oxide ($Ta_2O_5$), hafnium oxide ($HfO_2$), or zirconium oxide ($ZrO_2$).

18. The resistive random access memory according to claim 1, further comprising a block layer disposed between the oxygen exchange layer and the resistance-switching layer, wherein a material of the block layer comprises titanium-doped aluminum oxide, aluminum-doped titanium oxide, tantalum-doped titanium oxide, titanium-doped tantalum oxide, aluminum-doped tantalum oxide, tantalum-doped aluminum oxide, aluminum-doped hafnium oxide, hafnium-doped aluminum oxide, titanium-doped hafnium oxide, hafnium-doped titanium oxide, silicon-doped hafnium oxide, or zirconium-doped hafnium oxide.

* * * * *